United States Patent [19]

Murata et al.

[11] Patent Number: 4,574,384
[45] Date of Patent: Mar. 4, 1986

[54] SIGNAL TRANSFER SYSTEM USING A CHARGE TRANSFER DEVICE

[75] Inventors: Toshinori Murata, Yokohama; Masafumi Kazumi, Tokyo; Yuji Ito, Yokohama, all of Japan

[73] Assignee: Hitachi, Ltd., Tokyo, Japan

[21] Appl. No.: 525,696

[22] Filed: Aug. 23, 1983

[30] Foreign Application Priority Data

Aug. 25, 1982 [JP] Japan ................... 57-146156
Sep. 17, 1982 [JP] Japan ................... 57-160972

[51] Int. Cl.$^4$ .............................................. H03K 23/46
[52] U.S. Cl. ........................................ 377/58; 377/60; 377/63
[58] Field of Search .............. 377/57, 58, 59, 60, 377/61, 62, 63; 357/24

[56] References Cited

U.S. PATENT DOCUMENTS 4,139,784 2/1979 Sauer ................................. 377/57
4,194,133 3/1980 Shannon ........................ 357/24 M Primary Examiner—John S. Heyman
Assistant Examiner—Karl Ohralik
Attorney, Agent, or Firm—Antonelli, Terry & Wands

[57] ABSTRACT

A charge transfer device has one or more charge injection areas each having an input diffusion layer and two or more input gate electrodes. An input signal is applied to the input diffusion layer, a clock voltage is applied to one of the input gates and an input reference voltage is applied to the other input gate to inject a signal charge proportional to a difference between the input reference voltage and the input signal, and the signal charge is sequentially transferred. A magnitude of the input reference voltage is changed in accordance with a magnitude of a maximum value of the input signal so that transfer of charges which do not contribute to signal component is suppressed and a transfer efficiency is improved.

12 Claims, 10 Drawing Figures

SIGNAL TRANSFER SYSTEM USING A CHARGE TRANSFER DEVICE

BACKGROUND OF THE INVENTION

The present invention relates to a signal transfer system which prevents charges which do not change with time from being injected as signal charges in order to prevent saturation of transfer charges and which is particularly suitable to a tapped, charge coupled device (CCD).

As is well known, a CCD has a semiconductor substrate and electrodes insulated from the substrate and serially transfers signal charges of minority carriers stored in potential wells formed in the semiconductor substrate beneath the electrodes, in a longitudinal direction of a channel by applying a multiphase voltage to the electrodes. It has many applications in the field of signal processing such as a delay line for an analog signal.

Two methods for injecting signal charges to the CCD, are the diode cutoff method and the potential balance method which are disclosed in a Japanese version of "Charge Transfer Devices" by C. H. Séquin and M. F. Tompsett, in Bell Telephone Lab. in U.S.A., published Feb. 20, 1978, pages 42–46. However, neither of those methods teaches an efficient way to transfer charges nor suppression of transfer of spurious charges other than signal charges.

SUMMARY OF THE INVENTION

It is an object of the present invention to provide a signal transfer system having an improved transfer efficiency for charges used as signal components.

In accordance with the present invention, there is provided means for shifting the load line of an input signal in accordance with a change of a direct current component (mean value) or a peak value of an input signal waveform applied to a charge transfer device so that a peak of the input signal is held at a level which prevents charges which are not a function of the input signal useless from being injected.

DESCRIPTION OF THE PREFERRED EMBODIMENTS

Figure 1:
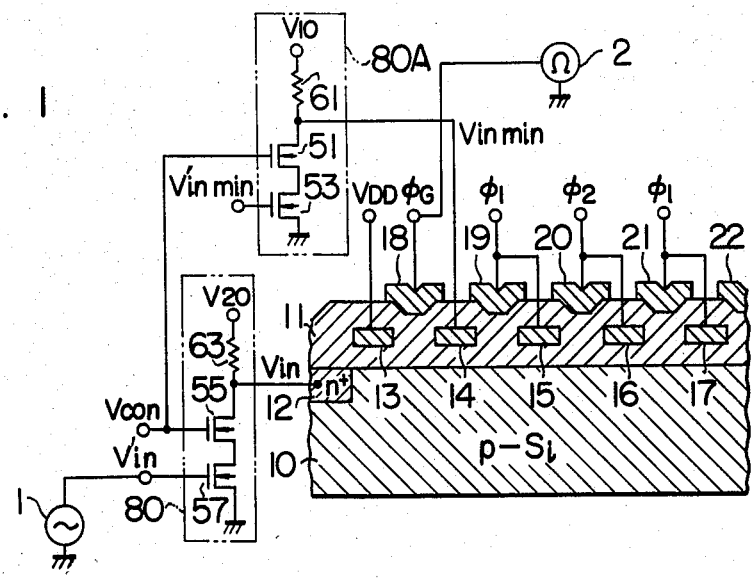
FIG. 1 shows a circuit diagram of a first embodiment of the present invention.

FIG. 1 shows a circuit diagram of one embodiment of the present invention. In FIG. 1 numeral 1 denotes a signal source, numeral 2 denotes a gate clock source, numeral 10 denotes a p-type silicon substrate, numeral 11 denotes an oxidized silicon layer, numeral 12 denotes an n-type diffusion layer and numerals 13–22 denote gate electrodes which are usually made of aluminum or poly-crystalline silicon. The oxidized silicon layer 11 insulates the substrate 10 from the gate electrodes 13–22. $V_{in}$ denotes an input signal voltage applied to the diffusion layer 12, $V_{DD}$ denotes a direct voltage, $\phi_G$ denotes a gate clock, $V_{in\,min}$ denotes an input reference direct bias voltage applied to the gate 14, and $\phi_1$ and $\phi_2$ denote charge transfer clocks. The n-MOSFET's 51 and 53 and a load resistor 61 form a peak voltage detection circuit 80A, and n-MOSFET's 55 and 57 and a load resistor 63 form a gain control circuit 80.

The diode cutoff method is first explained. To this end, let us assume that the input reference voltage $V_{in\,min}$ is not applied to the electrode 14, that is, the electrode 14 is connected to a fixed power supply of a voltage $V_{CC}$.

Figure 2:
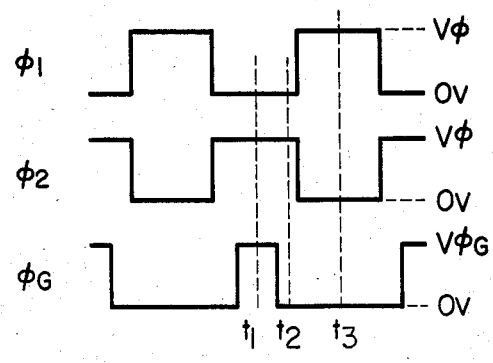
FIG. 2 shows waveforms for illustrating phase relations among clocks.
Figure 4:
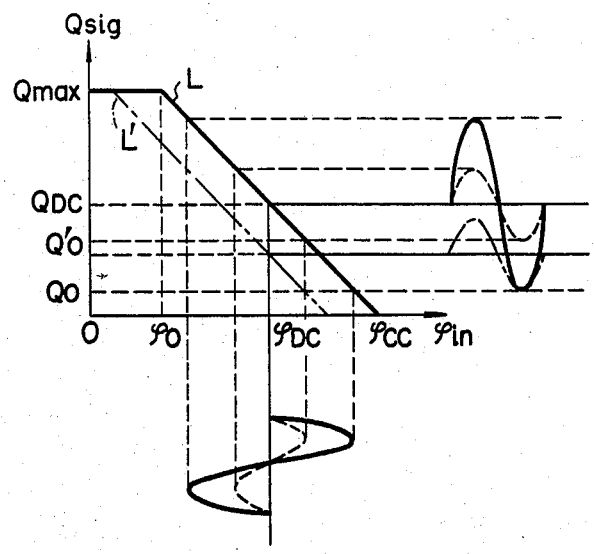
FIG. 4 shows the relationship between an input signal and a signal actually inputted to a charge transfer device.
Figure 3:
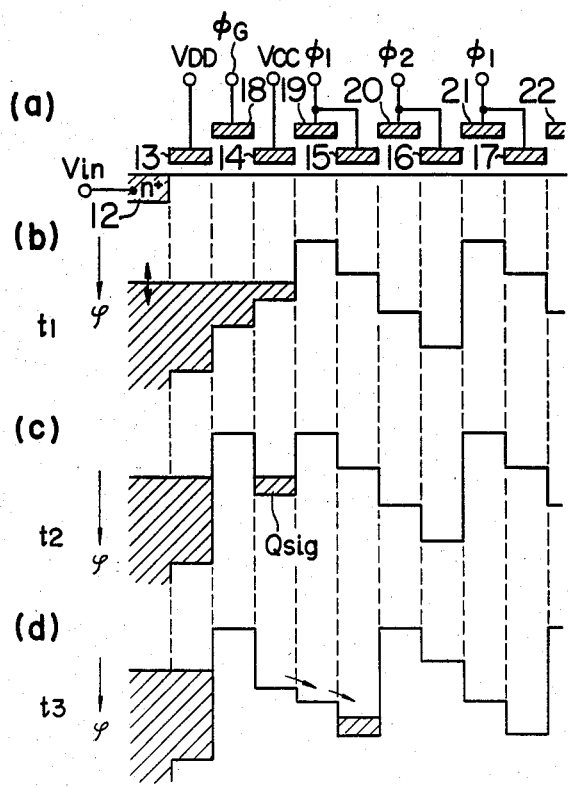
FIG. 3 illustrates transfer of charges.

FIG. 2 shows amplitudes and phases of the clocks $\phi_1$, $\phi_2$ and $\phi_G$ shown in FIG. 1. FIGS. 3(a), 3(b), 3(c) and 3(d) illustrate an operation of the CCD input area shown in FIG. 1 FIG. 3(a) is a diagram in the vicinity of a substrate surface of the input area and FIGS. 3(b) and 3(c) illustrate potentials in the substrate beneath the gate electrodes 13–22 and movement of charges at times $t_1$, $t_2$ and $t_3$ shown in FIG. 2. The input signal is applied to the n+-type diffusion layer 12 and the gate electrode 18 is opened at the time $t_1$ by the gate clock $\phi_G$ so that a charge proportional to the amplitude of the input signal is filled under the gate electrode 14 to which the input reference voltage $V_{CC}$ is applied. At the time $t_2$, the gate electrode 18 is closed by the gate clock $\phi_G$ and a signal charge $Q_{sig}$ is stored in a potential well formed by the gate electrodes 18, 14 and 19. This signal charge is transferred sequentially by the transferring clocks $\phi_1$ and $\phi_2$ after the time $t_3$ as shown in FIG. 3(d). The above operation is repeated so that signal charges $Q_{sig}$ representing the amplitudes of the input signal voltages $V_{in}$ are sequentially inputted to the CCD. The relationship between an internal potential $\phi_{in}$ and the signal charge $Q_{sig}$ is shown in FIG. 4, where $\phi_{in}$ is an internal potential under the n-type diffusion layer 12 and $\phi_{cc}$ is an internal potential under the gate electrode 14. When $\phi_{in} > \phi_{cc}$, the internal potential under the gate electrode 14 in FIG. 3(b) is smaller than the internal potential $\phi_{in}$ under the n-type diffusion layer 12 and hence the charge is not filled under the gate electrode 14 at the time $t_1$. Accordingly, $Q_{sig}=0$ at the time. When $\phi_o \leq \phi_{in} < \phi_{cc}$, $Q_{sig}$ changes linearly with respect to $\phi_{in}$. When $\phi_{in} < \phi_o$, $Q_{sig}$ is larger than a maximum stored charge $Q_{max}$ in the potential well at the transfer area of the CCD, saturation occurs. Accordingly, in order to secure a dynamic range, the mean value of the input signal is set such that the internal potential under the n-type diffusion layer 12 assumes $\phi_{DC}$ shown in FIG. 4.

When a signal shown by a broken line in FIG. 4 is transferred under such a condition, $Q'_o-Q_o$ is transferred as a spurious charge. Thus, in a charge transfer device like a tapped CCD delay line in which charges supplied from respective taps to a main transfer path are combined in the main transfer path, spurious charges from the respective taps are combined and the main transfer path saturates.

As a result, in the circuit of FIG. 1, the voltage of the electrode 14 is controlled in accordance with a peak value of the input voltage $V_{in}$ and a load line (L in FIG. 4) is shifted so that the charge corresponding to the peak value always assumes a minimum charge $Q_o$.

Figure 5:
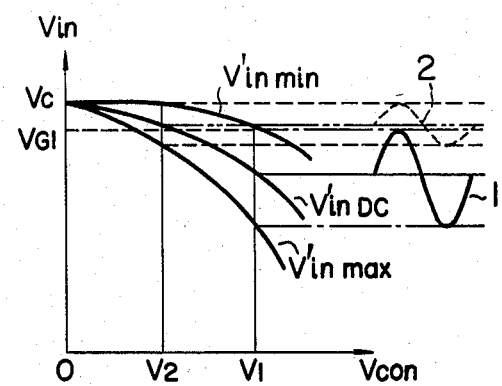
FIG. 5 shows a relation between a control voltage and an input signal.

$V'_{in}$ is an input signal to the gain control circuit 80, $V'_{in\ min}$ is a minimum voltage of the input signal $V'_{in}$, $V_{con}$ is a control voltage to control the gain of the gain control circuit 80 and the gain of the peak voltage detection current 80A, and $V_{10}$ and $V_{20}$ are direct voltages. FIG. 5 shows a relation between the output (or input to the CCO voltage $V_{in}$ of the gain control circuit 80 and the control voltage $V_{con}$. In FIG. 5, curve 1 shows a waveform of the output voltage $V_{in}$ when the control voltage $V_{con}$ is $V_1$, curve 2 shows a waveform of the output voltage $V_{in}$ when the control voltage $V_{con}$ is $V_2$, and $V_{G1}$ is a maximum voltage of the waveform 1. In the Peak voltage detection circuit 80A, the control voltage $V_{con}$ is applied to the gate of the n-MOSFET 51 and the minimum voltage $V'_{in\ min}$ of the input signal $V'_{in}$ is applied to the gate of the n-MOSFET 53. By selecting the resistance of the resistor 61 to be equal to that of the resistor 63, the peak voltage detection circuit 80A produces an output voltage which substantially follows a curve designated by the parameter $V'_{in\ min}$ in FIG. 5. Thus, the output voltage $V_{in\ min}$ is always coincident with the maximum of the output signal $V_{in}$ of the gain control circuit 80. The bias voltages $V_{10}$ and $V_{20}$ are selected such that a difference therebetween is equal to a difference between the potential under the diffusion layer 12 and the potential under the gate electrode 14.

Since the voltage applied to the gate electrode 14 changes in accordance with the peak value of the input voltage $V_{in}$, the load line also changes as shown by L and L' in accordance with the peak value of the input voltage $V_{in}$ so that the minimum value of the transfer charge is always maintained at $Q_o$. From a standpoint of high transfer efficiency, it is desirable that the minimum charge $Q_o$ is zero, but a certain direct current component is added in order to eliminate an influence by a non-linear portion of a rising region of the load line.

Figure 6:
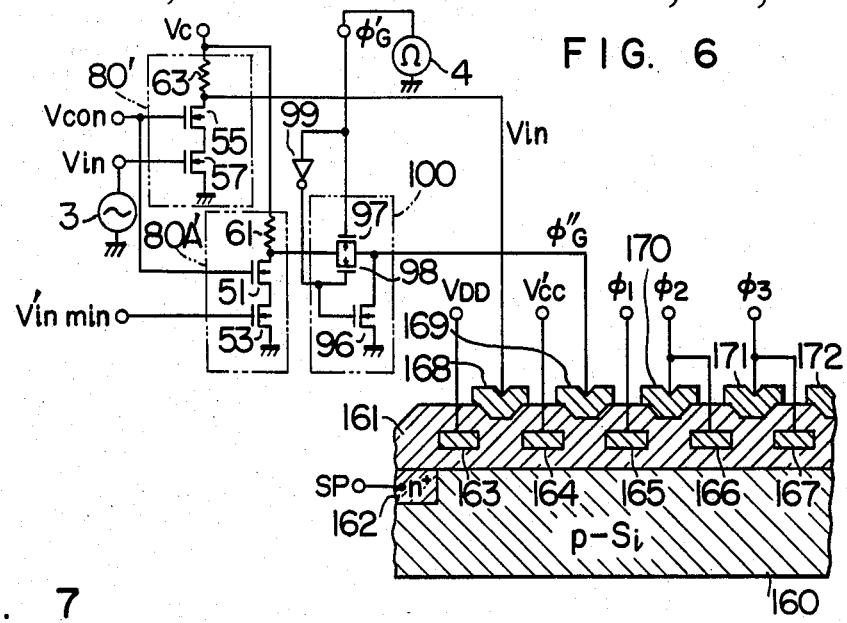
FIG. 6 shows a circuit diagram of a second embodiment of the present invention.

FIG. 6 shows a circuit diagram for the potential balance method. In FIG. 6 numeral 3 denotes a signal source, numeral 4 denotes a clock source, numeral 60 denotes a p-type silicon substrate, numeral 61 denotes an oxidized silicon layer, numeral 62 denotes an n+-type diffusion layer, and numerals 163-172 denote gate electrodes, which are made of aluminum or polycrystalline silicon. The oxidized silicon layer 61 insulates the substrate from the gate electrodes 163-172. $V_{in}$ is an input signal voltage, $V_{DD}$, $V'_{CC}$ and $V_c$ are direct voltages, $\phi_1$ and $\phi_2$ are charge transfer clocks, SP is a sampling clock and $\phi'_G$ is a signal charge inputting clock. Numerals 80A' and 80' denote circuits which are similar to the peak voltage detection circuit 80A' and the gain control circuit 80 shown in FIG. 1, and resistors 61 and 63 have the same resistance. Thus, the output voltage of the DC control circuit 80A is equal to the minimum output voltage of the gain control circuit 80'.

In a switching circuit 100 comprising n-MOSFET's 96 and 97 and a p-MOSFET 98, the n-MOSFET 97 and the p-MOSFET 98 conduct and the n-MOSFET 96 does not conduct when the clock $\phi'_G$ is at a high level. Thus, a voltage of an output clock $\phi''_G$ is equal to the output voltage of the peak voltage detection circuit 80A'. On the other hand, when the clock $\phi'_G$ is at a low level, the n-MOSFET 96 conducts and the n-MOSFET 97 and the p-MOSFET 98 do not conduct, and the voltage of the clock $\phi''_G$ is zero. Accordingly, the waveform of the clock $\phi''_G$ assumes a waveform shown in FIG. 7.

In order to explain the potential balance method, let us assume that the clock $\phi'_G$ is applied directly to the gate electrode 69.

Figure 8:
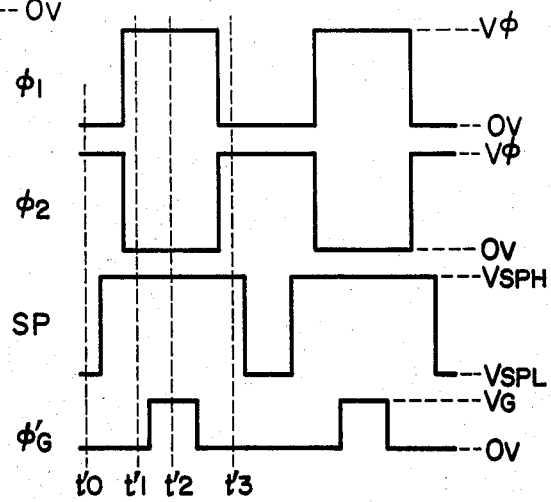
FIG. 8 shows waveforms for illustrating phase relations among clocks.
Figure 9:
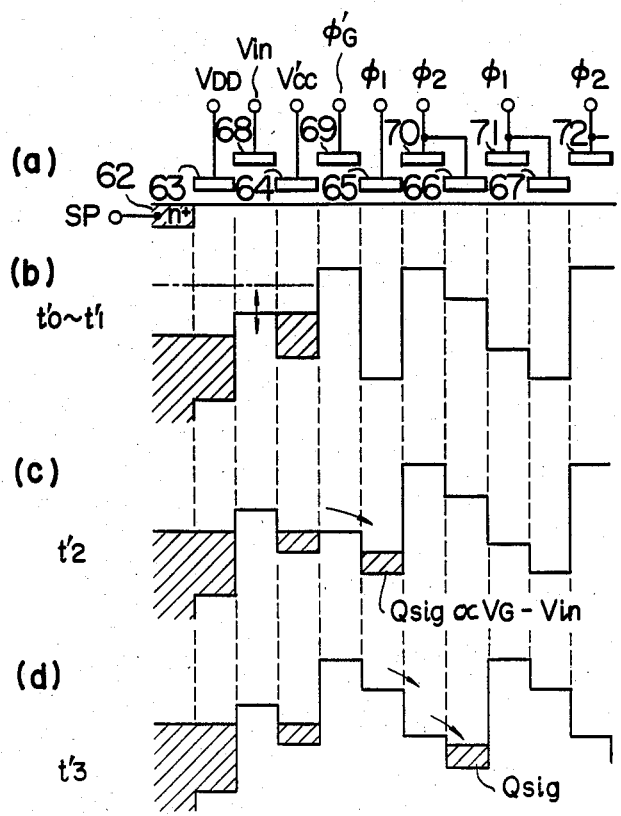
FIG. 9 illustrates transfer of charges.

FIG. 8 shows amplitudes and phases of the clocks $\phi_1$, $\phi_2$, SP and $\phi'_G$ shown in FIG. 6. FIGS. 9(a), 9(b), 9(c) and 9(d) illustrate an operation of a charge injection area. FIG. 9(a) shows a diagram in the vicinity of the substrate surface in the input area shown in FIG. 6 and FIGS. 9(b)–9(d) show potentials in the substrate under the gate electrodes 163-172 and the movement of the charges at times $t'_0$-$t'_3$ shown in FIG. 8. At the time $t'_0$, the internal potential under the n+-type diffusion layer 62 is at a level shown by a chain line in FIG. 9(b). At the time $t'_1$, the voltage of the sampling clock SP changes from $V_{SPL}$ to $V_{SPH}$ and the internal potential under the n-type diffusion layer 62 changes to a level shown by a solid line in FIG. 9(b) and a charge representing the magnitude of the input signal voltage $V_{in}$ applied to the gate electrode 68 is stored in a potential well formed by the gate electrodes 64, 68 and 69. At the time $t_2'$, the voltage of the signal charge inputting clock $\phi'_G$ applied to the gate electrode 69 changes from 0 to $V_G$, and a signal charge $Q_{sig}$ which is proportional to $V_G$-$V_{in}$ is stored in a potential well formed by the gate electrodes 65, 69 and 70 as shown in FIG. 9(c). Thereafter, the signal charge $Q_{sig}$ is sequentially transferred by the transfer clocks $\phi_1$ and $\phi_2$ as shown in FIG. 9(d). The above operation is repeated so that signal charges $Q_{sig}$ representing the magnitudes of the input signal voltages $V_{in}$ are sequentially injected to the CCD.

Since the load line shown in FIG. 4 is shifted by the clock voltage applied to the gate electrode 69, when the clock $\phi''_G$ is applied to the gate electrode 69, the load line is shifted in accordance with the peak value of the input signal in the same manner as the previous embodiment so that the spurious charges are not injected.

Figure 10:
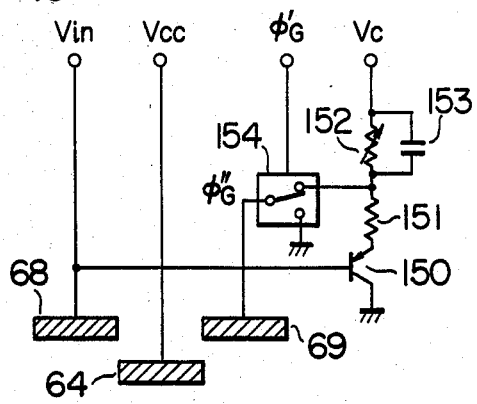
FIG. 10 shows a circuit diagram of a main portion of a third embodiment of the present invention.

If the signal applied to the charge transfer device has a constant amplitude and a varying direct current component, the spurious charge transfer can be reduced by a circuit shown in FIG. 10.

Figure 7:
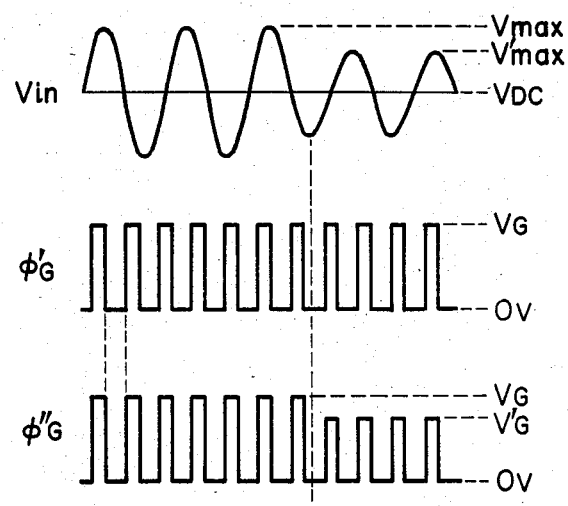
FIG. 7 shows waveforms of an input signal and an input clock signal.

FIG. 10 shows a main portion of a third embodiment of the present invention. Numeral 150 denotes a pnp transistor, numeral 151 denotes a resistor, numeral 152 denotes a potentiometer, numeral 153 denotes a capacitor, and numeral 154 denotes a switch (actually a transistor because of a high drive frequency) which is set to an upper contact when the clock $\phi'_G$ shown in FIG. 7 is at a high level and set to a lower contact when it is at a low level. The capacitor 153 serves to eliminate an AC component of the input signal $V_{in}$, and the potentiometer 152 is initially set such that the high level of the output signal $\phi_G'$ of the switching circuit 154 assumes the voltage satisfying the relationship between the internal potential $\phi_{DC}$ and $\phi_{cc}$ shown in FIG. 4.

Assume that the high level of the clock $\phi_G$ is equal to $V_G$ when the direct-current component of the input signal voltage $V_{in}$ is $V_{in\ DC}$. Then, the high level of the clock $\phi_G''$ is smaller than $V_G$ when the direct-current component of the input signal voltage $V_{in}$ is smaller than $V_{in\ DC}$ because the base voltage of the transistor 150 falls. Accordingly, the high level of the clock $\phi_G$ actually applied to the gate electrode 169 is proportional to the direct-current component of the input signal voltage $V_{in}$.

We claim:

1. A charge transfer system comprising:

a charge transfer device having a semiconductor substrate including a diffusion region, a first region adjacent to said diffusion region, a second region adjacent to said first region, and a third region to which charge carriers stored in said second region are transferred, a first electrode disposed above said first region and insulated from said substrate, and a second electrode disposed above said second region and insulated from said substrate, said charge carriers being responsive to a voltage difference between a voltage applied to said diffusion region and a voltage applied to said second electrode when a clock pulse is applied to said first electrode;

a signal source for generating an electrical signal to be charge-transferred;

a clock pulse source for supplying said clock pulse to said first electrode of said charge transfer device;

signal supply means connected between said signal source and said diffusion region of said charge transfer device for controlling an amplitude of a signal applied to said diffusion region; and control means for supplying a bias voltage varying with a change of a peak value of said electrical signal to said second electrode of said charge transfer device so as to maintain a minimum value of said charge carriers corresponding to said peak value of said electrical signal at a relatively constant value.

2. A charge transfer system according to claim 1 wherein said control means includes first and second gain control units each having first and second input terminals and an output terminal, an output voltage at said output terminal being independently controlled by input voltages applied to said first and second input terminals, said first input terminal and said output terminal of said first gain control unit being connected to said signal source and said diffusion layer, respectively, said first input terminal and said output terminal of said second gain control unit being connectd to a power supply of a voltage equal to a minimum value of said electrical signal and said second gate electrode, respectively, and said second input terminals of said first and second gain control units being connected together.

3. A charge transfer system according to claim 2 wherein each of said first and second gain control units includes first and second transistors and a load, said first and second input terminals are connected to control electrodes of said first and second transistors, respectively, and a connection point of said second transistor and said load is connected to said output terminal.

4. A charge transfer system comprising:

a charge transfer device having a semiconductor substrate including first region, a second region adjacent to said first region, a third region adjacent to said second region, and a fourth region to which charge carriers stored in said second region are transferred, first, second and third electrodes insulated from said substrate and disposed above said first, second and third regions, respectively, said charge carriers at said second region being responsive to a voltage applied to said first electrode if a voltage applied to said second electrode is constant, and transferred charge carriers from said second region to said fourth region being responsive to a voltage applied to said third electrode;

a signal source for generating an electrical signal;

a direct voltage source for supplying a constant bias voltage to said second electrode;

a clock pulse source for generating a clock pulse for said third electrode of said charge transfer device;

signal supply means connected between said signal source and said first electrode of said charge transfer device for controlling an amplitude of a signal applied to said first electrode; and pulse control means connected to said clock pulse source and said third electrode of said charge transfer device for supplying a clock pulse whose amplitude varies with a change of a peak value of said electrical signal so as to maintain a minimum value of said transferred charge carriers corresponding to said peak value of said electrical signal at a relatively constant value.

5. A charge transfer system according to claim 4 wherein said potential at said predetermined portion of said electrical signal is a peak value of said electrical signal.

6. A charge transfer system according to claim 4 wherein said potential at said predetermined portion of said electrical signal is a mean value of said electrical signal.

7. A charge transfer system comprising:

a charge transfer device having a semiconductor substrate including a diffusion region, a first region adjacent to said diffusion region, a second region adjacent to said first region, and a third region to which charge carriers stored in said second region are transferred, a first electrode disposed above said first region and insulated from said substrate, and a second electrode disposed above said second region and insulated from said substrate, said charge carriers being responsive to a voltage difference between a voltage applied to said diffusion region and a voltage applied to said second electrode when a clock pulse is applied to said first electrode;

a terminal adapted to be connected to a signal source for generating an electrical signal to be charge-transferred;

a terminal adapted to be connected to a clock pulse source for supplying said clock pulse to said first electrode of said charge transfer device;

signal supply means connected between said terminal adapted to be connected to said signal source and said diffusion region of said charge transfer device for controlling an amplitude of a signal applied to said diffusion region; and control means for supplying a bias voltage varying with a change of a peak value of said electrical signal to said second electrode of said charge transfer device so as to maintain a minimum value of said charge carriers corresponding to said peak value of said electrical signal at a relatively constant value.

8. A charge transfer system according to claim 7 wherein said control means includes first and second gain control units each having first and second input terminals and an output terminal, an output voltage at said output terminal being independently controlled by input voltage applied to said first and second input terminals, said first input terminal of said first gain control unit being said terminal adapted to be connected to the signal source, said output terminal of said first gain control unit being connected to said diffusion layer, said first input terminal and said output terminal of said second gain control unit being connected to a power supply of a voltage equal to a minimum value of said electrical signal and said second gate electrode respectively, and said second input terminals of said first and second gain control units being connected together.

9. A charge transfer system in accordance with claim 8, wherein each of said first and second gain control units includes first and second transistors and a load, said first and second input terminals are connected to control electrodes of said first and second transistors, respectively, and a connection point of said second transistor and said load is connected to said output terminal.

10. A charge transfer system comprising:
a charge transfer device having a semiconductor substrate including a first region, a second region adjacent to said first region, a third region adjacent to said second region, and a fourth region to which charge carriers stored in said second region are transferred, first, second and third electrodes insulated from said substrate and disposed above said first, second and third regions, respectively, said charge carriers at said second region being responsive to a voltage applied to said first electrode if a voltage applied to said second electrode is constant and transferred charge carriers from said second region to said fourth region being responsive to a voltage applied to said third electrode;
a terminal adapted to be connected to a signal source for generating an electrical signal;
a terminal adapted to be connected to a direct voltage source for supplying a constant bias voltage to said second electrode;
a terminal adapted to be connected to a clock pulse source for generating a clock pulse for said third electrode of said charge transfer device;
signal supply means connected between said terminal adapted to be connected to said signal source and said first electrode of said charge transfer device for controlling an amplitude of a signal applied to said first electrode; and
pulse control means connected to said terminal adapted to be connected to said clock pulse source and said third electrode of said charge transfer device for supplying a clock pulse whose amplitude varies with a change of a peak value of said electrical signal so as to maintain a minimum value of said transfer charge carriers corresponding to said peak value of said electrical signal at a relatively constant value.

11. A charge transfer system according to claim 10, wherein said potential at said predetermined portion of said electrical signal is a peak value of said electrical signal.

12. A charge transfer system according to claim 10, wherein said potential at said predetermined portion of said electrical signal is a mean value of said electrical signal.

* * * * *